(12) United States Patent
Kim et al.

(10) Patent No.: US 6,842,030 B2
(45) Date of Patent: Jan. 11, 2005

(54) TEST SYSTEMS FOR LOW-TEMPERATURE ENVIRONMENTAL TESTING OF SEMICONDUCTOR DEVICES

(75) Inventors: Yoon-Min Kim, Suwon-shi (KR); Ki-Yeul Kim, Osan-shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/336,931

(22) Filed: Jan. 6, 2003

(65) Prior Publication Data

US 2003/0137317 A1 Jul. 24, 2003

(30) Foreign Application Priority Data

Jan. 7, 2002 (KR) .................... 2002-0000675

(51) Int. Cl.$^7$ .............................................. G01R 31/02

(52) U.S. Cl. ........................................ 324/765; 324/760

(58) Field of Search ............................ 324/760, 765, 324/158.1, 73.1; 165/80.3, 80.4

(56) References Cited

U.S. PATENT DOCUMENTS

| 5,880,592 | A | * | 3/1999 | Sharpes et al. | ............. 324/760 |
| 6,114,868 | A | * | 9/2000 | Nevill | ........................ 324/760 |
| 6,313,653 | B1 | | 11/2001 | Takahashi et al. | .......... 324/760 |

FOREIGN PATENT DOCUMENTS

| JP | 06-118136 | 4/1994 | ........... G01R/31/28 |
| JP | 07-209373 | 8/1995 | ........... G01R/31/26 |
| JP | 00-035459 | 2/2000 | ........... G01R/31/26 |
| JP | 2000-035459 | 2/2000 | ........... G01R/31/26 |

* cited by examiner

*Primary Examiner*—Vinh P. Nguyen
(74) *Attorney, Agent, or Firm*—Mills & Onello LLP

(57) ABSTRACT

A test system for an integrated circuit chip, protects a circuit board from frost during low temperature testing. The test system comprises sealing means capable of removably attaching to a second surface of the test circuit board and for sealing a portion of the second surface to isolate the portion of the second surface of the test circuit board from ambient air. In this manner, the sealing unit prevents generation of frost at the solder junction portion of the test circuit, which would otherwise lead to leakage failures during test.

27 Claims, 8 Drawing Sheets

TEST SYSTEMS FOR LOW-TEMPERATURE ENVIRONMENTAL TESTING OF SEMICONDUCTOR DEVICES

RELATED APPLICATION

This application relies for priority upon Korean Patent Application No. 2002-00675, filed on Jan. 7, 2002, the contents of which are herein incorporated by reference in their entirety.

FIELD OF THE INVENTION

The present invention relates to test systems for integrated circuit chips and, more specifically, to test systems for integrated circuit chips that protect circuit boards under test from the effects of low temperatures.

BACKGROUND OF THE INVENTION

As System On a Chip (SOC) products continue to become more highly integrated, the importance of tests becomes more emphasized. In particular, as applications of the SOC products become more varied, products must be warranted to operate properly even in extreme environments. To ensure this, the products are subject to high-temperature tests, low-temperature tests, high voltage stress (HVS) tests, and the like. Temperature tests are indispensable for applications of the SOC products. In particular, a very low temperature test, which is performed at a temperature of approximately −45 to −90° C., is the most difficult for products to pass. While a few leakage failures are demonstrated in high-temperature tests, leakage failures in low-temperature tests are quite common. This is because, at low temperatures, the supercooled atmosphere under a board (also referred to as a "test circuit board, interconnection board, or performance board") is condensed into a solid state, i.e. "frost", which may cause a leakage failure. Most test apparatuses for semiconductor packages include structures in which the exterior air continues to flow into a test head (under the board) in order to cool the test head. In this case, a terminal of a socket connected to a semiconductor package is composed of metals and therefore transmits heat at a faster rate than the board. Thus, the frost is generated first at a bottom of the board, especially, in the region of the socket containing solder. Also, while the exterior air flowing past the test head continues to flow past the bottom of the board, the amount of frost increases, which can cause a shorting effect and leakage failure.

Such leakage failures increase the time required for testing characteristics of products. Even worse, the test itself may not be conducted. In particular, since the leakage failures commonly arise at the time of the start of the test at −90° C., there is no precedent for testing of characteristics of products at −90° C.

The leakage failures arise as follows. According to the Clausius-Clapeyron Equation that describes the correlation between saturated vapor pressure (es) and temperature (T), when an atmosphere of a constant humidity falls down below the dew point without change in pressure, the water vapor in the atmosphere becomes supersaturated. At this time, frost or water drops are generated at a bottom of a test board of low temperature, and this leads to the leakage failures during the testing of products. While testing semiconductor products, the leakage failures may cause serious errors in measurements of all items including a function test and an analog test. Accordingly, sources of the leakage current should be removed to complete a very low temperature test.

In conventional attempts to resolve this issue, a material for substituting the atmosphere having the humidity, i.e., a heated dry gas is used to prevent dew condensation or the like at a low temperature (Japanese Publication Patent No. 12-35459, hereinafter referred to as "Reference 1"). In an alternative approach, an insulating liquid or an insulating solid is coated on a board where dew condensation is expected (Japanese Publication Patent No. 6-118136, hereinafter referred to as "Reference 2").

However, in Reference 1, where a heated dry gas is utilized, because each semiconductor test apparatus of different structure requires an airtight space, a dry gas, a drying passage, a heating board, or a socket guide, the cost of each apparatus model is increased. In addition, since they occupy a large amount of space, considerable costs and space are required for multiple test apparatuses. In addition, since a ventilating device is required for the dry gas, there are many restrictions for its practical use.

Meanwhile, in Reference 2, adhesion of an insulating liquid or insulating solid with a board is of primary importance. In the case of the insulating liquid, when the liquid of very low temperature (−90° C.) is condensed into a solid, the insulator changes in volume. In the case of the insulating solid, due to a difference in thermal expansion between the board and the insulator, dew condensation may be generated in a gap therebetween. As a result, boards and electronic parts attached to the bottoms of the boards may be damaged. Further, in this approach, coating of the insulating liquid or insulating solid on each board is inconvenient, and since the insulating liquid or solid coating cannot be reused, the process involves continuous costs. In addition, after attaching the insulator to the underside of the boards, it is not easy to remove the attached insulator. This makes it difficult to exchange or test the electronic parts.

SUMMARY OF THE INVENTION

The present invention is directed to a system that addresses the aforementioned limitations of the conventional approaches. In doing so, it is a feature of the present invention to provide a test system for an integrated circuit chip including a test board for protecting the underside of a board from frost during extreme environmental testing.

It is another feature of the present invention to provide a test system for an integrated circuit chip, which is flexibly applicable to all kinds of semiconductor test apparatuses and may be readily installed and removed so as to correspond to a range of products under test.

In accordance with a first aspect of the present invention, a test system for an integrated circuit chip comprises a test circuit board, a temperature controller for placing one or more integrated circuit chips mounted to a first surface of the test circuit board under a predetermined temperature condition, a sealing unit capable of removably attaching to a second surface of the test circuit board and for sealing at least a portion of the second surface, such that the portion of the second surface is isolated from ambient air, and a tester for electrically connecting to the test circuit board to test characteristics of the one or more integrated circuit chips.

In a preferred embodiment of the present invention, electric circuit parts for testing the one or more integrated circuit chips are mounted to the second surface of the test circuit board, and wherein the isolated portion of the second surface includes electric circuit parts.

The sealing unit includes an impermeable cover capable of covering the isolated portion, and an adhesive tape for sealing and adhering the cover of the test circuit board to the second surface.

The cover may be composed of a material selected from the group consisting of synthetic resins, rubbers, metals, and ceramics, and may have a transparent window or a moisture absorbent material.

The region where the one or more integrated circuit chips are mounted may be positioned in the region where the electric circuit parts are mounted.

In one embodiment, the sealing unit includes the impermeable cover capable of covering the electric circuit parts, and the cover is sealed and adhered to the second surface of the test circuit board by screws.

The temperature controller provides temperature controlled air to the one or more integrated circuit chips, thereby placing the one or more integrated circuit chips under a predetermined temperature condition. Also, the test system includes means for providing the air from the temperature control means to a space between the second surface and the cover of the test circuit board. The test system includes means for exhausting the air provided to the space between the second surface and the cover of the test circuit board.

In the preferred embodiment of the present invention, the test system for the integrated circuit chip may include one or more penetrating holes for providing the air provided to the one or more integrated circuit chips to the space between the second surface and the cover.

This invention may be embodied in different forms and should not be constructed as limited to the embodiment set forth herein. Rather, the embodiment is provided so that this disclosure will be thorough and complete, and will fully convey the scope of the invention to those skilled in the art. In the drawings, the thickness of layers and regions are exaggerated for clarity.

The test system for the integrated circuit chip of the present invention includes the sealing means, which is mounted on a bottom of a test circuit board. The sealing means isolates the test circuit board from the flow of ambient air. Because a predicted amount of water vapor content is limited to the inner space of the sealing means, which is cut off from the flow of air, frost is not generated in that region to a degree that is significant enough to cause a leakage failure.

BRIEF DESCRIPTION OF THE DRAWINGS

Additional objects and advantages of the present invention will be more readily apparent from the following detailed description of preferred embodiments thereof when taken together with the accompanying drawings in which.

DETAILED DESCRIPTION OF PREFERRED EMBODIMENTS

Figure 1:
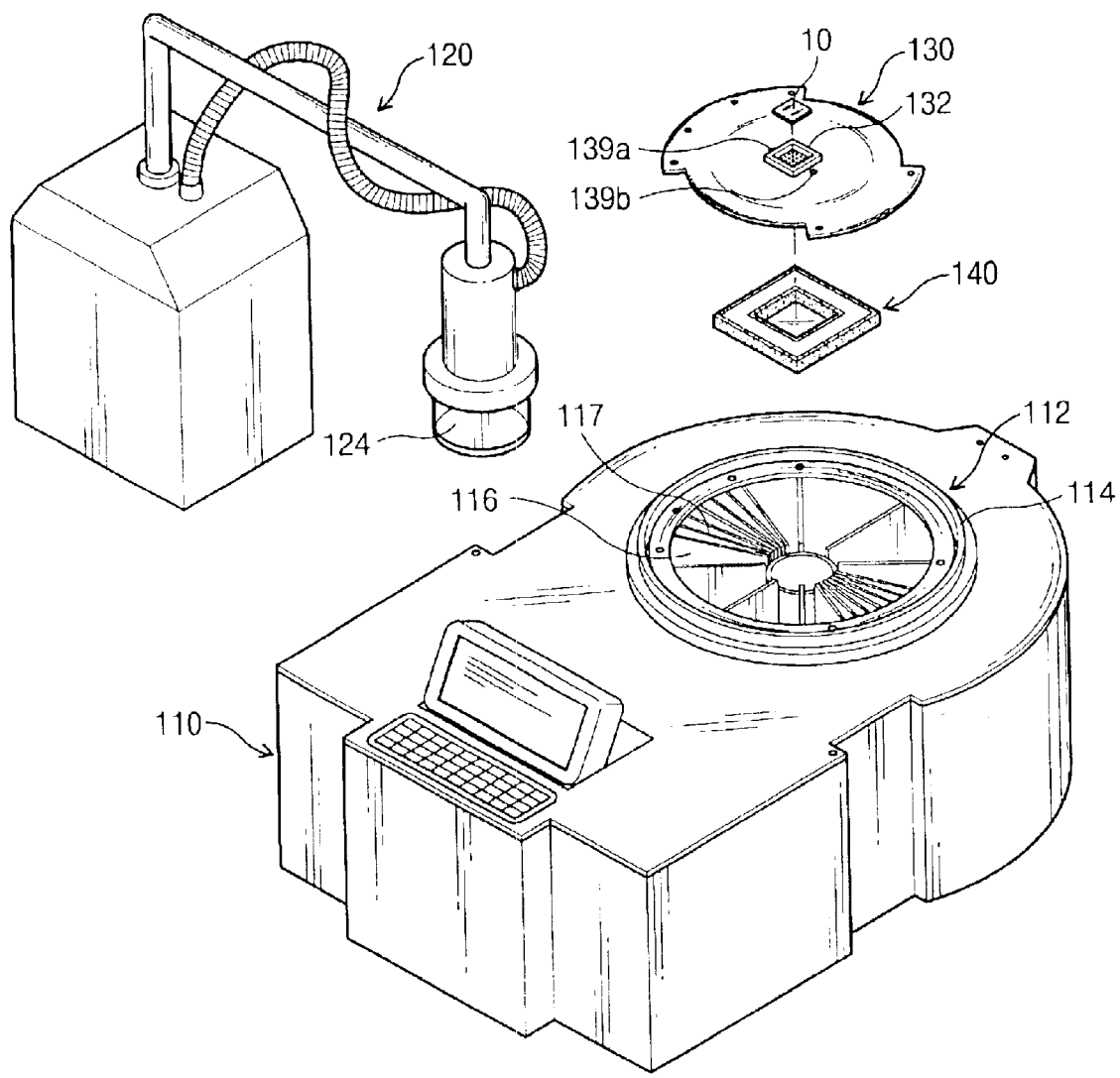
FIG. 1 is a perspective view illustrating a test system according to a preferred embodiment of the present invention.

FIG. 1 is a test system for a semiconductor device according to a preferred embodiment of the present invention.

Referring to FIG. 1, the test system for the semiconductor device comprises a test circuit board 130, a temperature control apparatus 120, a tester 110, and sealing means 140.

Figure 5:
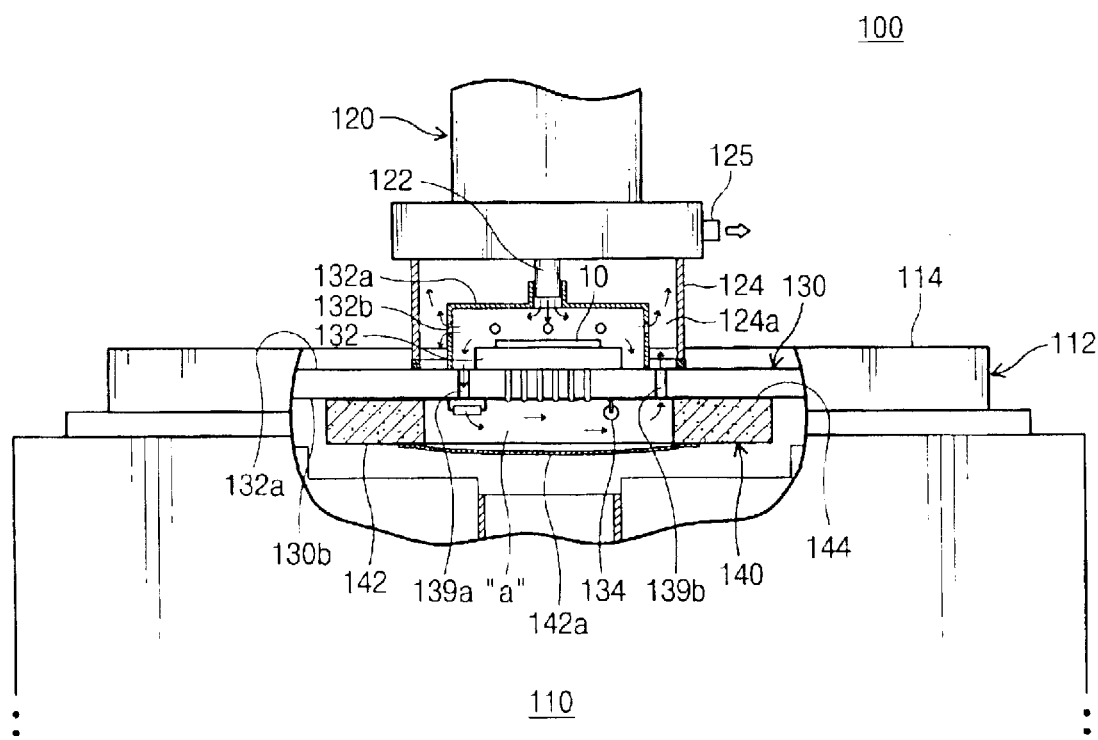
FIG. 5 is a diagram for illustrating a very low temperature test with the test system for a semiconductor device according to the preferred embodiment of the present invention.

The temperature control apparatus 120 provides air at a very low temperature or at a very high temperature to a semiconductor integrated circuit chip 10 under test (hereinafter inclusively referred to as "a semiconductor device"), such that the semiconductor device is placed under a predetermined temperature condition (−90 to 125° C.). As illustrated in FIG. 5, the temperature control apparatus 120 has an air jet nozzle 122 and a transparent cylinder 124 surrounding the air jet nozzle 122. A suitable temperature control apparatus is available from Temptronic of INTEST Corporation.

The tester 110 is electrically connected to the test circuit board 130 to test characteristics of the semiconductor device 10. The tester 110 has a test head 112 or a measuring part, which is electrically connected to the test circuit board 130 and proceeds with the test. The test head 112 has a mounting part 114 where the test circuit board 130 is mounted, at an upper part of the test head 112. Channel pins 117 (commonly referred to as "pogo pins"), which are electrically connected to the test circuit board 130, are positioned at the mounting part 114. The channel pins 117 are included in channel cards 116, and the channel cards 116 are mounted in the test head 112. Although not shown in the drawings, the tester 110 further includes an operating part and a computer for controlling tests.

Figure 2:
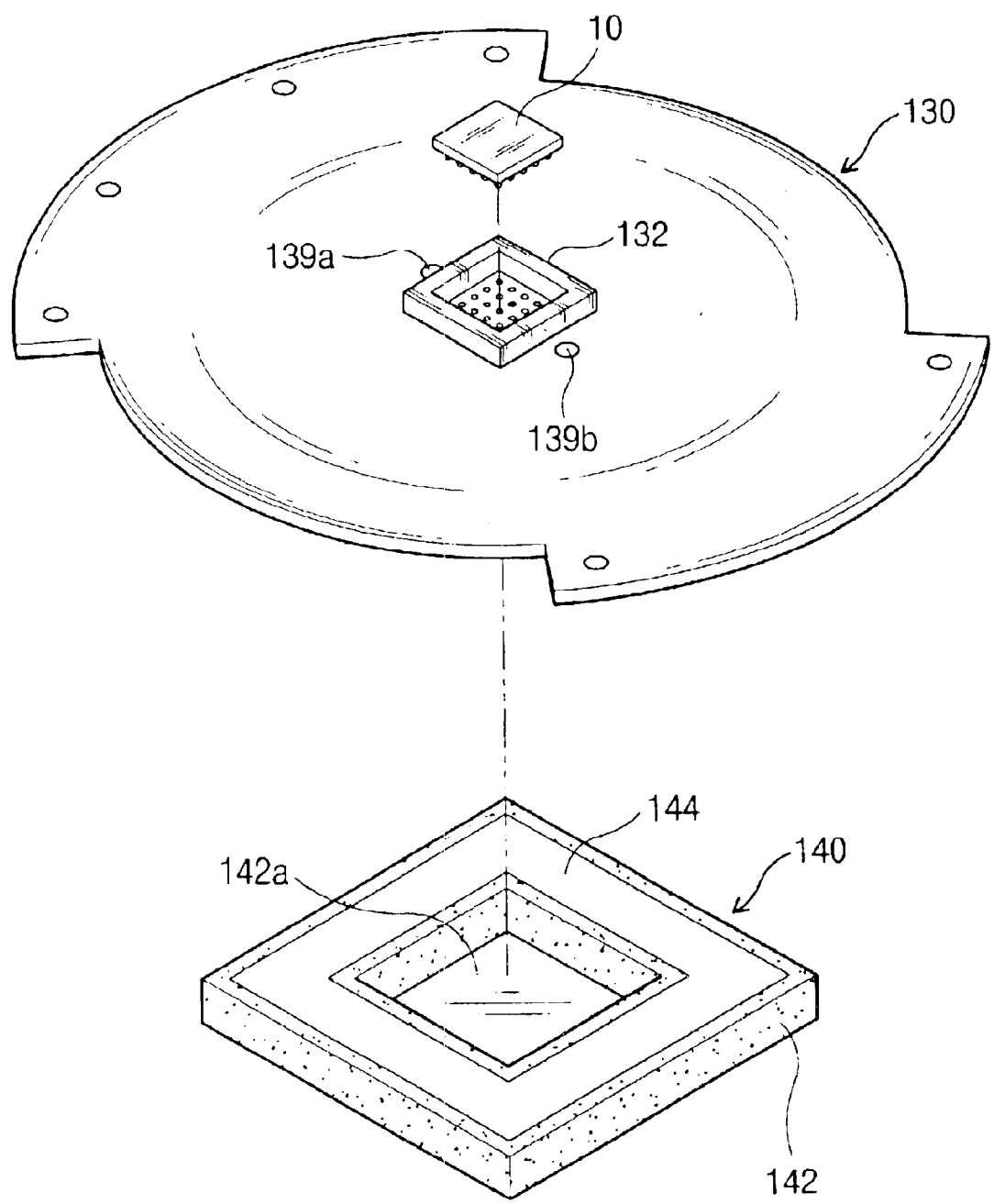
FIG. 2 is a perspective view of a test circuit board and sealing means as illustrated in FIG. 1.
Figure 3:
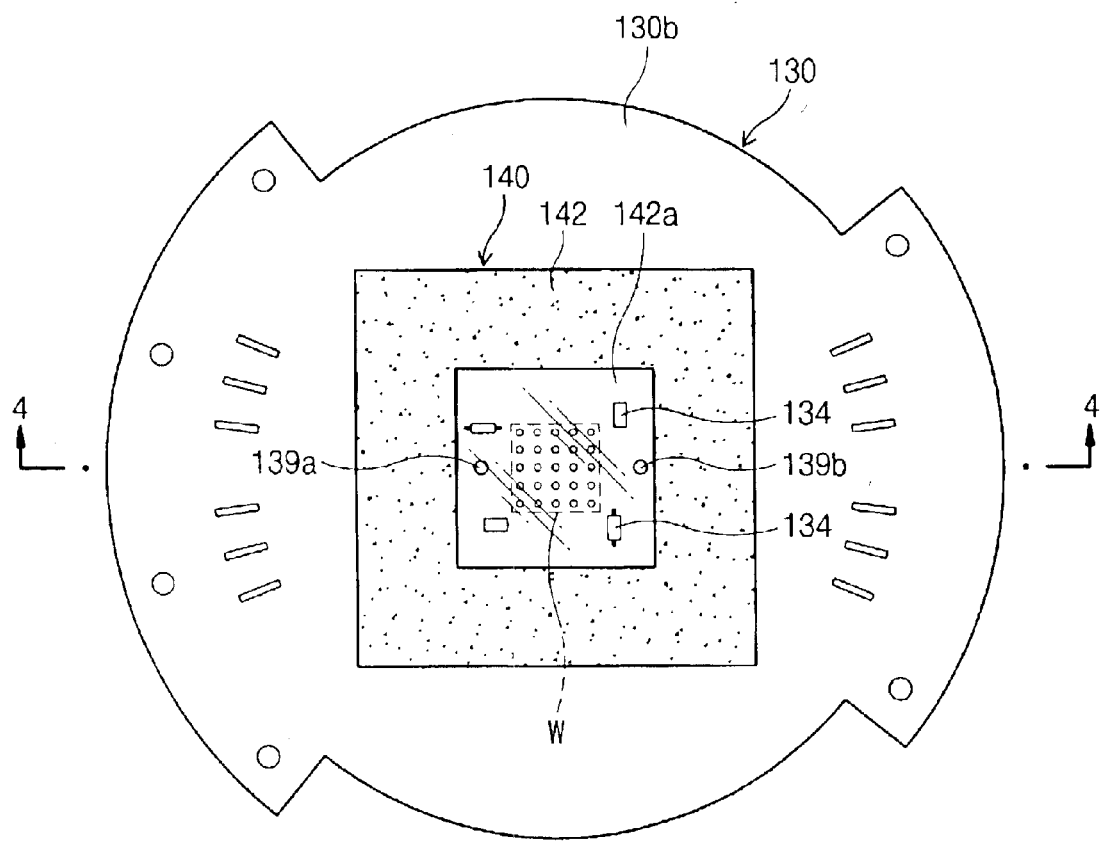
FIG. 3 is a bottom view of the test circuit board where the sealing means is mounted.
Figure 4:
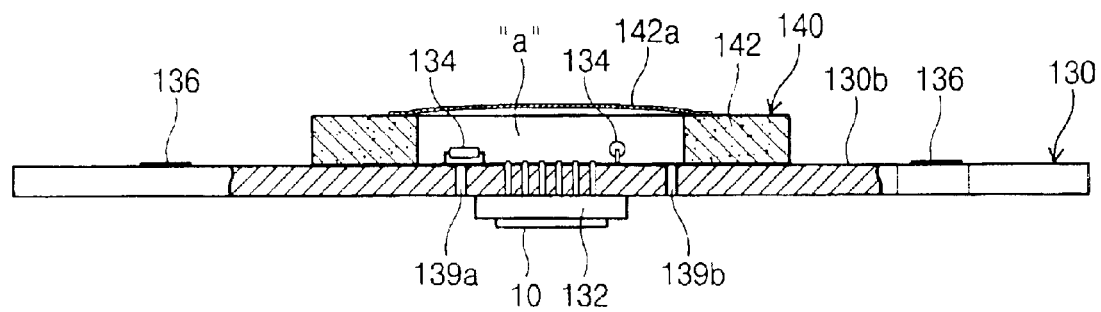
FIG. 4 is a lumbar cross-sectional view taken along the line 4—4 of FIG. 3.

FIGS. 2 to 4 illustrate a test circuit board and sealing means, which are the most characteristic components in the present invention.

Referring to FIGS. 2 to 4, the test circuit board 130 (normally called "a device under test (DUT) board") includes a socket 132 where the semiconductor device 10 is mounted, electric circuit parts 134 required for testing the semiconductor device 10, and contact pads 136 electrically connected to the channel pins 117 positioned at the mounting part 114 of the tester head 112. The socket 132 is connected to the test circuit board 130 by soldering. The electric circuit parts 134 may include active devices such as a resistor, a condenser, and an inductor, as well as switching devices such as a relay. They are preferably mounted closest to the region where the socket 132 is soldered.

The test circuit board 130 includes means for guiding the air of low temperature and low humidity from the temperature control apparatus 120 to a space (a) between a bottom 130b of the test circuit board 130 and the sealing means 140 (hereinafter referred to as "an inner space"). The air guiding means includes first and second penetrating holes 139a and 139b formed in the vicinity of the socket 132. As illustrated in FIG. 5, the air of low temperature and low humidity provided from the temperature control apparatus flows into the inner space (a) through the first penetrating hole 139a, and flows out through the second penetrating hole 139b. Alternatively, the second penetrating hole 139b may be formed on the cover of the sealing means 140, rather than the test circuit board 130. The position and operation of the first and second penetrating holes will be described in detail below.

The sealing means 140 is removably mounted to the bottom 130b of the test circuit board 130, and seals the portion of the bottom 130b of the test circuit board 130 surrounding the chip under test. The sealing means 140 is mounted to the bottom 130b of the test circuit board 130, thereby buffering, or isolating, the region where the socket 132 is soldered (illustrated as a dotted line; w) from ambient air.

The sealing means 140 includes an impermeable cover 142 capable of covering the electric circuit parts 134, and an adhesive member 144 for adhering the cover 142 to the bottom 130b of the test circuit board 130. An adhesive tape, a dual-sided adhesive tape, and an adhesive can be used for the adhesive member. For example, the cover 142 is preferably made of a size large enough to seal off a bottom 130b region of the test circuit board 130 surrounding the circuit under test.

The cover 142 is composed, for example, of synthetic resins, having an elasticity so as to ensure reliable adhesion with the test circuit board 130. The cover 142 has an inner space (a) insulated from ambient air, where the electric circuit parts 134 are positioned in the center, as well as a confirmatory window 142a to allow for external examination of the inner space (a). In this manner, a user can observe through the confirmatory window 142a whether frost is generated in the inner space (a). For instance, in addition to synthetic resins, the cover 142 may be composed of one selected from the group consisting of rubbers, metals, and ceramics. Meanwhile, to remove moisture from the inner space, the cover 142 can be formed of a moisture absorbent material (not shown).

The structural characteristics of the present invention are such that the test system for the semiconductor device comprises sealing means for cutting off from the air at the bottom of the test circuit board, and the sealing means is capable of removably attaching to the bottom of the test circuit board. In addition, the sealing means has a simple structure, which is flexibly applicable to a variety of test circuit boards and is amenable to frequent change of products. According to the structural characteristics, while the electric circuit parts and the soldering region of the socket are in contact with the supercooled, or heated air, the flow of air having moisture may be cut off. As a result, the common causes of leakage failure are removed. Since the sealing means is flexibly applicable to all types of test systems for semiconductor devices, and a few sealing means can be used for a number of apparatuses, additional devices or apparatuses are not needed for testing at very low temperature, considerably limiting required storage space and costs. For example, the semiconductor device 10 under test may comprise a wafer chip or a packaged device, and the same sealing means may apply.

Hereinafter, a very low temperature test utilizing the test system for a semiconductor device according to the preferred embodiment of the present invention will be described with reference to FIGS. 1 and 5.

To begin with, the cover 142 of the sealing means 140 is attached and secured to the bottom 130b of the test circuit board 130, for example, by dual-sided adhesive tape. The cover 142 is mounted on the bottom 130b of the test circuit board, thereby isolating the soldering region (as illustrated in FIG. 3; w) where the electric circuit parts 134 are mounted such that the soldering region w of the socket is exposed only to the test environment air contained in the inner space (a). The test circuit board 130 is mounted at the mounting part 114 of the test head 112 of the tester 110, such that the socket 132 where the semiconductor device 10 is mounted faces upward. The socket 132 is covered by socket cover 132a, and transparent cylinder 124 of the temperature control apparatus 120 is applied to a top surface 130a of the test circuit board 130. The air jet nozzle 122 is above the socket cover 132a as shown. Test environment air of low temperature and low humidity provided by the temperature control apparatus 120 is applied to the semiconductor device 10 positioned in the socket cover 132a through the air jet nozzle 122. When the semiconductor device 10 is cooled, the soldered portion of the socket 132 and the adjacent electric circuit parts 134 are slowly cooled. However, water vapor content in the inner space (a) is very slight and controlled. Accordingly, even if all the water vapor in the test environment is condensed to frost, the frost is generated to a very slight amount as compared with the very low temperature test under the conventional apparatus. In the present invention, because the absolute water vapor content is greatly reduced, the frost is not generated to a degree that would cause leakage failure.

Meanwhile, one portion of the air provided to the semiconductor device 10 flows out into a cylindrical region between the transparent cylinder 124 and the socket cover 132a through a hole 132b formed by a side of the socket cover 132a, and another portion of the air flows into the inner space (a) through the first penetrating hole 139a. The air flowing into the inner space (a) flows out into the cylindrical space 124a between the socket cover 132a and the transparent cylinder 124 through the second penetrating hole 139b. The air in the cylindrical space 124a is exhausted through an exhaust port 125, which is positioned at an upper portion of the transparent cylinder 124. In this manner, air of low temperature and low humidity is provided to the inner space (a), thereby preventing generation of even the slightest frost in the inner space (a). The foregoing flow of air is illustrated as arrows in FIG. 5.

Figure 6:
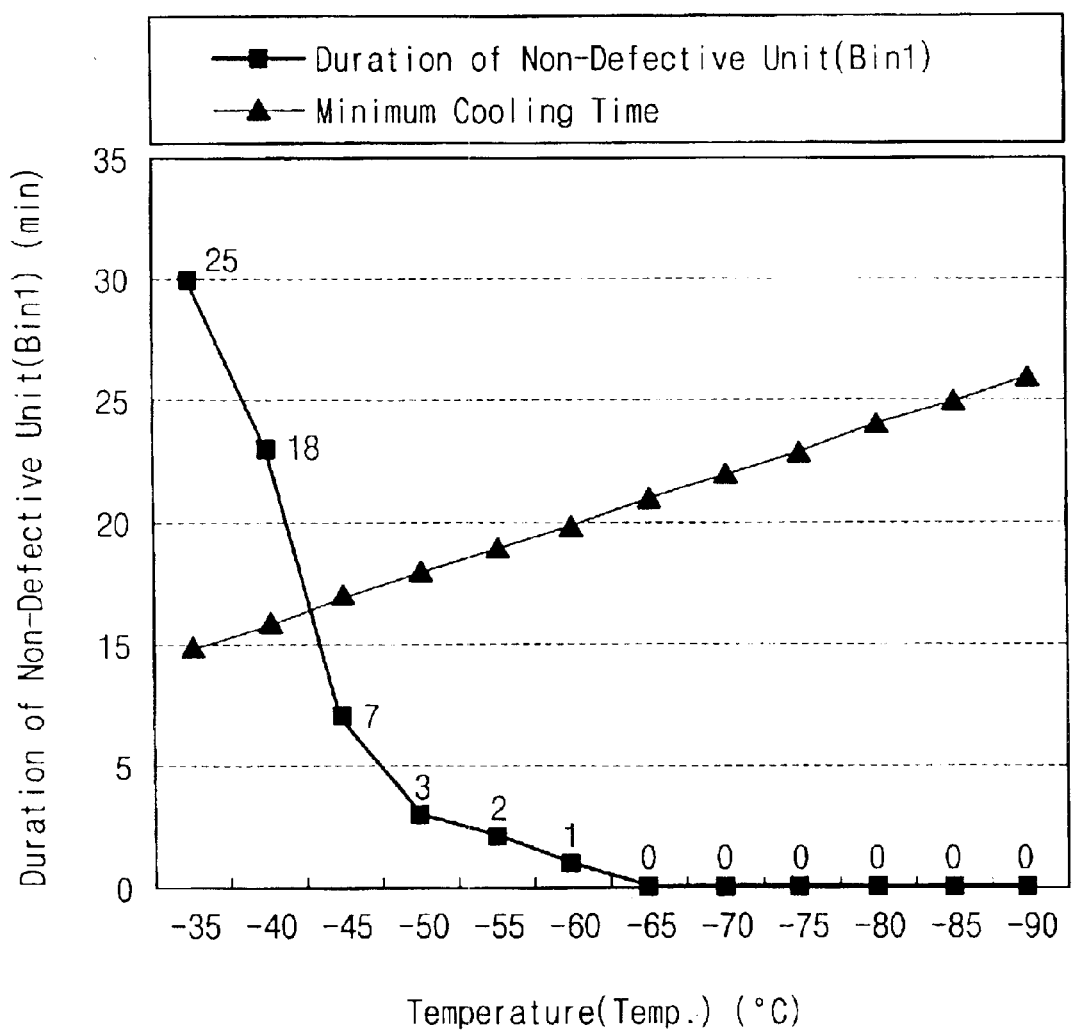
FIGS. 6 and 7 are graphs showing results of very low temperature tests according to a conventional apparatus and the present invention, respectively.
Figure 7:
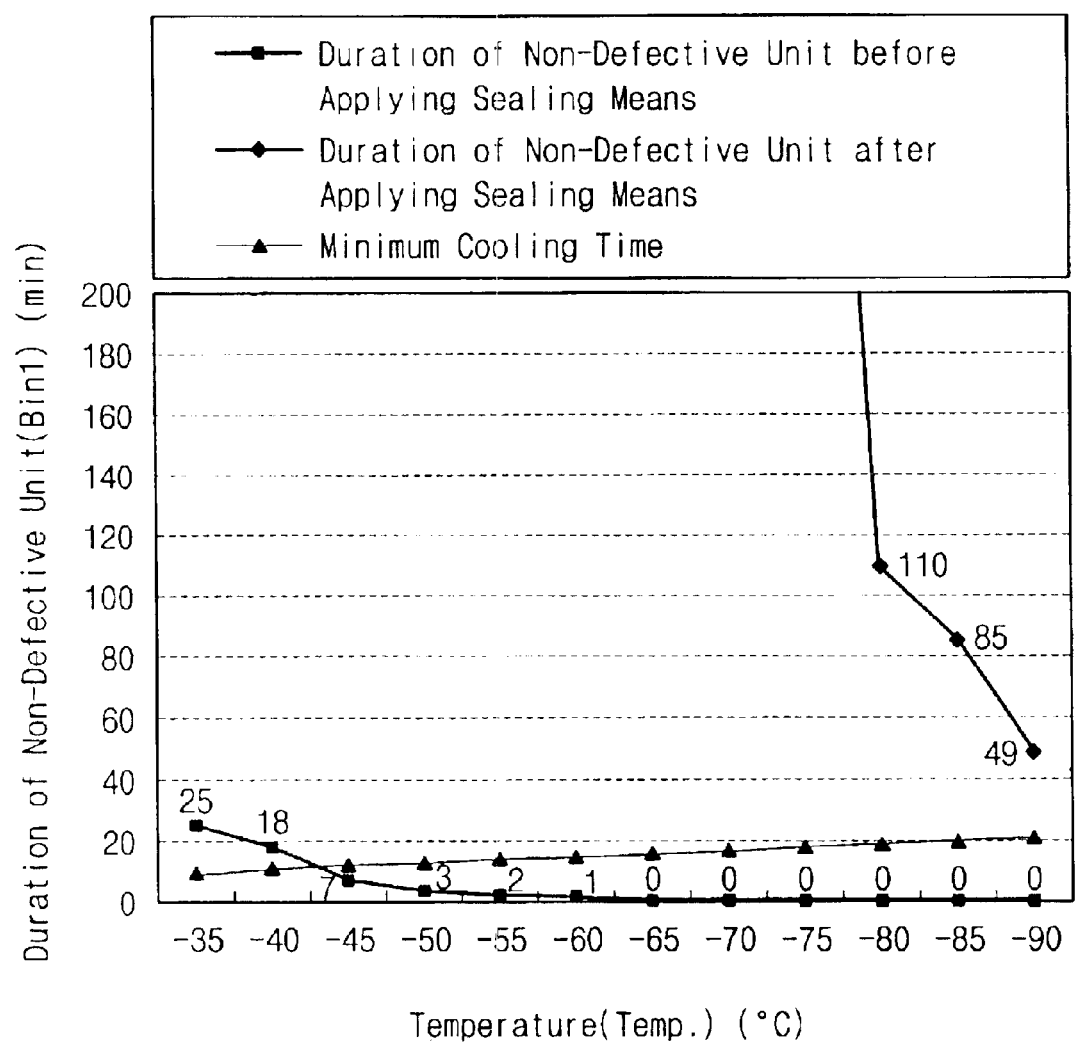

FIGS. 6 and 7 are comparative graphs showing results of the very low temperature test according to a conventional apparatus and the present invention, respectively.

To begin with, FIG. 6 is a graph showing test results wherein, absent any sealing means 140, a duration of a non-defective unit and a minimum cooling time are measured, respectively, as a function of temperature, and the average values of both are calculated. In FIG. 6, a minimum cooling time is the least time for cooling the test circuit board down to a predetermined temperature. Because the test circuit board is cooled and also dehumidified to prevent generation of frost on the test circuit board, the minimum cooling time is required.

The non-detective unit (Bin 1) represents a state under which a leakage current does not arise in the test circuit board. The parameter duration of a non-detective unit represents the time passed until a leakage current is generated on the bottom of the test circuit board due to frost while cooling the test circuit board to the predetermined temperature and maintaining the predetermined temperature.

Accordingly, to enable the very low temperature test of the test circuit board, while cooling to the predetermined temperature and testing the characteristic of the semiconductor device under the temperature, the test circuit board should maintain a state of the non-detective unit during the very low temperature test.

However, in view of FIG. 6 showing results of the very low temperature test of the conventional apparatus, a minimum cooling time was 17 minutes if the predetermined temperature is −45° C., while the duration of a non-detective unit at that temperature was 7 minutes. Because the flow of an exterior air was not cut off from the bottom of the test circuit board, before cooling the test circuit board to −45° C., frost was generated on the bottom of the test circuit board by the exterior air. This resulted in a leakage current. Therefore, the very low temperature test of the test circuit board was impossible at −45° C. Referring to FIG. 6, it was possible to test the very low temperature characteristic of the test circuit board at more than −40° C., which is the temperature corresponding to the crossing point of the graph representing the duration of a non-detective unit and the graph representing a minimum cooling time. However, the very low temperature test was impossible at −40° C. or less.

FIG. 7 shows the results under which the duration of a non-defective unit and a minimum cooling time according to temperature are respectively measured, using the test system according to the preferred embodiment of the present invention, and the average values of both are calculated.

As illustrated in FIG. 7, according to the present invention, it can be seen that a duration of a non-defective unit is greatly increased. At a temperature of −70° C. or more, leakage failures were not generated at all. At the low temperature of −90° C., the real time for testing at a very low temperature excluding a minimum cooling time was 28 minutes. While a test time depends on kinds of products and items of measurements, considering that the average test time is 20 minutes, the test system of the present invention makes it possible to test most products at a very low temperature for a sufficient time period.

As described above, in the present invention, semiconductor devices can be tested at a very low temperature of −90° C., which was impossible to achieve in the conventional apparatuses. That is, in addition to industrial products, products intended for military and satellite applications can be tested at a very low temperature.

Figure 8:
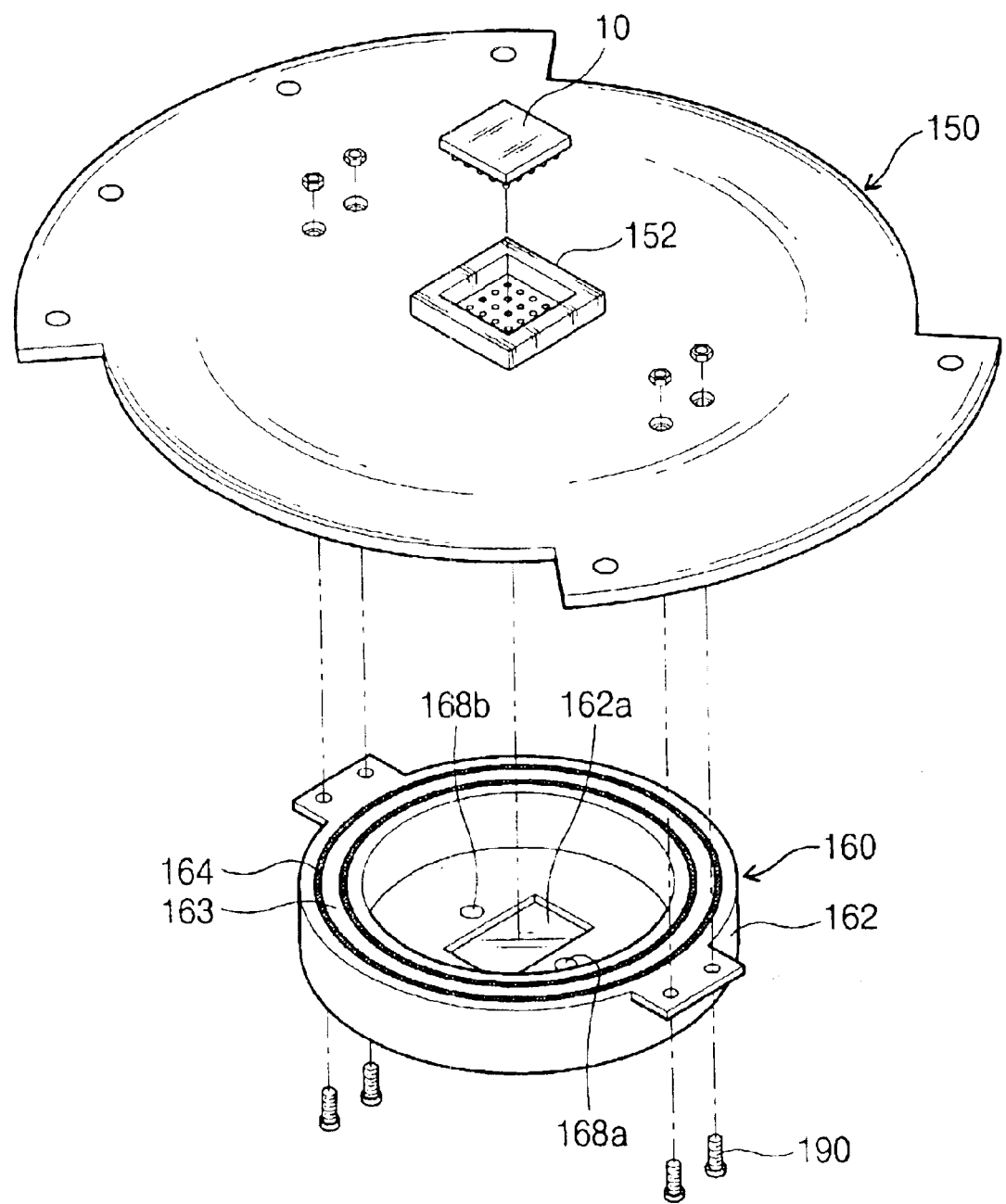
FIGS. 8 and 9 are diagrams of an alternative example of the sealing means, in accordance with the present invention.
Figure 9:
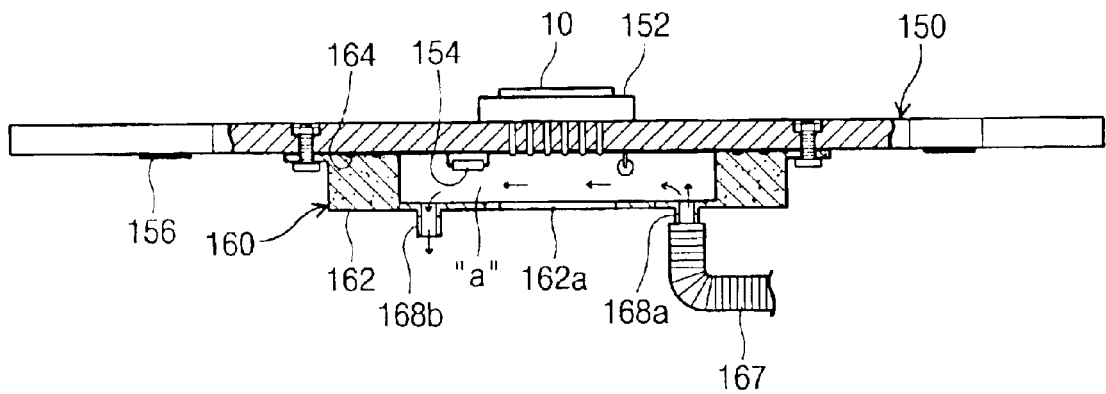

FIGS. 8 and 9 illustrate alternative examples of the sealing means.

The sealing means 160 and the test circuit board 150 illustrated in FIGS. 8 and 9 perform the same function as the sealing means 140 and the test circuit board 130 illustrated in FIG. 2. The sealing means 160 according to this example comprises a hard cover 162 and a sealing member 164. The test circuit board 150 has a socket 152, electric circuit parts 154, and contact pads 156, as described above. The cover 162 comprises a hard plastic member of a box type with one side open, and has a confirmatory window 162a for observation. The cover 162 is sealed and adhered to a bottom of the test circuit board 150 by a plurality of screws 190. The sealing member 164, for example in the form of a single ring, or multiple concentric rings, as shown, conforms and adheres to the bottom 150b of the test circuit board 150 and a contact surface 163 of the cover 162.

FIG. 9 illustrates air guiding means of the transformed sealing means illustrated in FIG. 8. The air guiding means as illustrated in FIG. 9 includes a providing tube 167 for directly providing the air of low temperature and low humidity from the temperature control apparatus 120 to the inner space (a), an inflow hole 168a connected to the providing tube 167, and an outflow hole 168b for exhausting the air provided to the inner space (a). Although not shown in the drawings, the providing tube 167 is connected to receive air from the temperature control apparatus 120. In this embodiment, the holes 139a, 139b through the test circuit board shown in FIG. 5 are not required.

While this invention has been particularly shown and described with references to preferred embodiments thereof, it will be understood by those skilled in the art that various changes in form and details may be made herein without departing from the spirit and scope of the invention as defined by the appended claims.

As explained above, the present invention can prevent generation of frost, which in turn is responsible for leakage failures during test, by isolating the circuit under test from ambient air, unlike the costly and complicated conventional approach. In addition, it is unnecessary to change hardware or test apparatus for a very low temperature test. Accordingly, the present invention is applicable without applying additional cost or space to the existing test system. In addition, the present invention is flexibly applicable to existing test systems, and can be easily attached and removed so as to promptly correspond to any instant change of products under test. This enables reduction in time for developing products. Finally, the present invention is amenable to use with a variety of test systems.

What is claimed is:

1. A test system for an integrated circuit chip comprising:
   a test circuit board;
   a temperature controller for placing one or more integrated circuit chips, which are mounted on a first surface of the test circuit board, under a predetermined temperature condition;
   a sealing unit removably attachable to a second surface of the test circuit board and for sealing at least a portion of the second surface to isolate the portion of the second surface from ambient air, an inner space region being formed between the second surface and the sealing unit into which controlled test environment air is provided; and
   a tester electrically connected to the test circuit board and for testing characteristics of the one or more integrated circuit chips.

2. The test system as claimed in claim 1, wherein electric circuit parts for testing the one or more integrated circuit chips are mounted to the second surface of the test circuit board, and wherein the isolated portion of the second surface includes the electric circuit parts.

3. The test system as claimed in claim 2, wherein the electric circuit parts are mounted in a region that corresponds to a location where the one or more integrated circuit chips are mounted.

4. The test system as claimed in claim 1, wherein the sealing unit comprises:
   an impermeable cover capable of covering the isolated portion of the second surface; and
   an adhesive member for sealing and adhering the cover to the second surface of the test circuit board.

5. The test system as claimed in claim 4, wherein the cover is composed of a material selected from the group consisting of synthetic resins, rubbers, metals, and ceramics.

6. The test system as claimed in claim 4, wherein the cover has a transparent window.

7. The test system as claimed in claim 4, wherein the cover further comprises a moisture absorbent material disposed at a space between the second surface and the cover.

8. The test system as claimed in claim 4, wherein the adhesive member is an adhesive tape.

9. The test system as claimed in claim 4, wherein the adhesive member is a double-sided adhesive tape.

10. The test system as claimed in claim 1, wherein the predetermined temperature condition ranges from −90 to 125° C.

11. The test system as claimed in claim 1, wherein the sealing unit includes an impermeable cover capable of covering the isolated portion of the second surface, and wherein the cover is connected to the second surface of the test circuit board by screws.

12. The test system as claimed in claim 1, wherein the temperature controller provides temperature controlled air to the one or more integrated circuit chips, thereby placing the one or more integrated circuit chips under the predetermined temperature condition.

13. The test system as claimed in claim 12, further comprising air providing means for providing the temperature controlled air from the temperature controller to the inner space region.

14. The test system as claimed in claim 13, further comprising means for exhausting the air provided to the inner space region.

15. The test system as claimed in claim 13, wherein the air providing means comprises one or more penetrating holes formed on the test circuit board, such that the air provided to the one or more integrated circuit chips flows to the space in the isolated portion of the second surface.

16. The test system as claimed in claim 1, wherein the controlled test environment air applied to the inner space region is provided by the temperature controller.

17. The test system as claimed in claim 1, wherein the controlled test environment air includes at least one of controlled temperature air and controlled humidity air.

18. A test system for an integrated circuit chip comprising:
   a test circuit board;
   a temperature controller for placing one or more integrated circuit chips, which are mounted on a first surface of the test circuit board, under a predetermined temperature condition;
   a sealing unit removably attachable to a second surface of the test circuit board and for sealing at least a portion of the second surface to isolate the portion of the second surface from ambient air, wherein the sealing unit comprises an impermeable cover capable of covering the isolated portion of the second surface; and an adhesive member for sealing and adhering the cover to the second surface of the test circuit board; and
   a tester electrically connected to the test circuit board and for testing characteristics of the one or more integrated circuit chips.

19. The test system as claimed in claim 18, wherein the cover is composed of a material selected from the group consisting of synthetic resins, rubbers, metals, and ceramics.

20. The test system as claimed in claim 18, wherein the cover has a transparent window.

21. The test system as claimed in claim 18, wherein the cover further comprises a moisture absorbent material disposed at a space between the second surface and the cover.

22. The test system as claimed in claim 18, wherein the adhesive member is an adhesive tape.

23. The test system as claimed in claim 18, wherein the adhesive member is a double-sided adhesive tape.

24. A test system for an integrated circuit chip comprising:
   a test circuit board;
   a temperature controller for placing one or more integrated circuit chips, which are mounted on a first surface of the test circuit board, under a predetermined temperature condition;
   a sealing unit removably attachable to a second surface of the test circuit board and for sealing at least a portion of the second surface to isolate the portion of the second surface from ambient air, wherein the sealing unit includes an impermeable cover capable of covering the isolated portion of the second surface, and wherein the cover is connected to the second surface of the test circuit board by screws; and
   a tester electrically connected to the test circuit board and for testing characteristics of the one or more integrated circuit chips.

25. A test system for an integrated circuit chip comprising:
   a test circuit board;
   a temperature controller that provides temperature controlled air for placing one or more integrated circuit chips, which are mounted on a first surface of the test circuit board, under a predetermined temperature condition;
   a sealing unit removably attachable to a second surface of the test circuit board and for sealing at least a portion of the second surface to isolate the portion of the second surface from ambient air;
   a tester electrically connected to the test circuit board and for testing characteristics of the one or more integrated circuit chips; and
   air providing means for providing the temperature controlled air from the temperature controller to the isolated portion of the second surface.

26. The test system as claimed in claim 25, further comprising means for exhausting the air provided to the space in the isolated portion of the second surface.

27. The test system as claimed in claim 25, wherein the air providing means comprises one or more penetrating holes formed on the test circuit board, such that the air provided to the one or more integrated circuit chips flows to the space in the isolated portion of the second surface.

* * * * *